United States Patent
Chang

(10) Patent No.: US 7,272,016 B2
(45) Date of Patent: Sep. 18, 2007

(54) INTERFACE CARD COUPLING STRUCTURE

(75) Inventor: Lin-Wei Chang, Taipei (TW)

(73) Assignee: Inventec Corporation, Taipei (TW)

( * ) Notice: Subject to any disclaimer, the term of this patent is extended or adjusted under 35 U.S.C. 154(b) by 171 days.

(21) Appl. No.: 11/105,351

(22) Filed: Apr. 14, 2005

(65) Prior Publication Data

US 2006/0232947 A1 Oct. 19, 2006

(51) Int. Cl.
H05K 7/12 (2006.01)
(52) U.S. Cl. .............. 361/801; 361/726; 361/732; 361/747; 361/759; 439/327; 312/223.2
(58) Field of Classification Search .......... 361/801, 361/726, 732, 740, 747, 759; 439/325–327; 312/223.2, 223.3
See application file for complete search history.

(56) References Cited

U.S. PATENT DOCUMENTS 5,383,793 A * 1/1995 Hsu et al. ............... 439/327
5,603,628 A * 2/1997 Schapiro, Jr. ........... 439/327
5,822,193 A * 10/1998 Summers et al. ........ 361/759
6,183,284 B1 * 2/2001 Gill et al. ............... 439/327
6,299,468 B1 * 10/2001 Lin ........................ 439/327
7,002,811 B2 * 2/2006 Jing et al. ............... 361/801

* cited by examiner

Primary Examiner—Tuan Dinh
Assistant Examiner—Dameon E. Levi
(74) Attorney, Agent, or Firm—Birch, Stewart, Kolasch & Birch, LLP

(57) ABSTRACT

An interface card coupling structure includes a bracing member fastened to a case that has a retaining plate extending from an edge with a latch hole formed thereon, and a coupling member pivotally coupled on the retaining plate. The coupling member has a latch pin on one end facing the retaining plate to engage with the latch hole and anchor the coupling member on the retaining plate. The coupling member presses an interface card to form secure coupling. The coupling member may be made by injection forming. The structural elements of the bracing member of the interface card coupling structure are thus fewer. Hence the cost may be reduced and production speed increased.

9 Claims, 6 Drawing Sheets

INTERFACE CARD COUPLING STRUCTURE

FIELD OF THE INVENTION

The invention relates to a coupling structure, and particularly to an interface card coupling structure to anchor an interface card on a mainboard with a reinforced coupling.

BACKGROUND OF THE INVENTION

A typical computer is coupled with many interface cards. This is especially true for larger computers or industrial computers for which there are many types of interface cards. When used for a prolonged period of time in an environment where vibrations occur or moving happens frequently, the interface cards are prone to loosen or break away from the insertion slots (not shown in the drawings). To prevent the interface card from breaking away from the insertion slot, a coupling structure is usually used to anchor one end of the interface card as shown in FIG. 1. Such a coupling structure generally includes a bracing member 100, which has a retaining plate 101 and a coupling plate 102 extended from one end. The retaining plate 101 and the coupling plate 102 are normal to each other. The coupling plate 102 has a latch hole 1021 to couple with a coupling member 103 of the retaining plate 101. The coupling member 103 is elastically coupled with a latch member 104, which is slidable on the coupling member 103. The latch member 104 has a latch pin 1041 extended from one end of the coupling member 103 to couple with the latch hole 1021 and anchor the coupling member 103 on the retaining plate 101. The coupling member 103 can press an interface card (not shown in the drawing) to prevent the interface card from breaking away from the insertion slot.

In the conventional structure set forth above, the coupling member 103 and the latch member 104 are assembled to provide the coupling function. The coupling plate 102 has to provide the latch hole 1021 to receive the latch pin 1041 to anchor the coupling member 103 on the retaining plate 101 and press the interface card. All this requires many elements and results in a higher cost. This is not economical, especially in today's business environment where the profit margin is small and competition is fierce. There is still room for improvement in terms of structural simplification, cost reduction and use effectiveness.

SUMMARY OF THE INVENTION

In view of the aforesaid problems, the primary object of the invention is to provide an interface card coupling structure that has a simplified structure to increase production and reduce cost.

In order to achieve the foregoing object, the interface card coupling structure of the invention involves coupling an interface card with a mainboard case. The interface card coupling structure includes a bracing member fixedly mounted onto the case. The bracing member has a retaining plate extended from an edge with a latch hole formed thereon. A coupling member is provided to be pivotally coupled with the retaining plate. The coupling member has a latch pin on one end facing the retaining plate to couple with the latch hole, anchor the coupling member on the retaining plate, and enable the coupling member to press the interface card.

In addition, the coupling member has a clipping member on the pivotal coupling end to press the interface card. The clipping member has one end fixedly located on the pivotal coupling end and another free end that is elastic. The coupling member further has a stopping member on one end. The bracing member has a notch on one end mating with and bracing the stopping member.

Moreover, a second bracing member is provided and anchored on the case. The second bracing member is parallel with the bracing member that has one end corresponding to the pivotal coupling end of the coupling member.

In the structure set forth above, the coupling member may be made by injection forming to simplify elements, reduce cost, and increase production.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
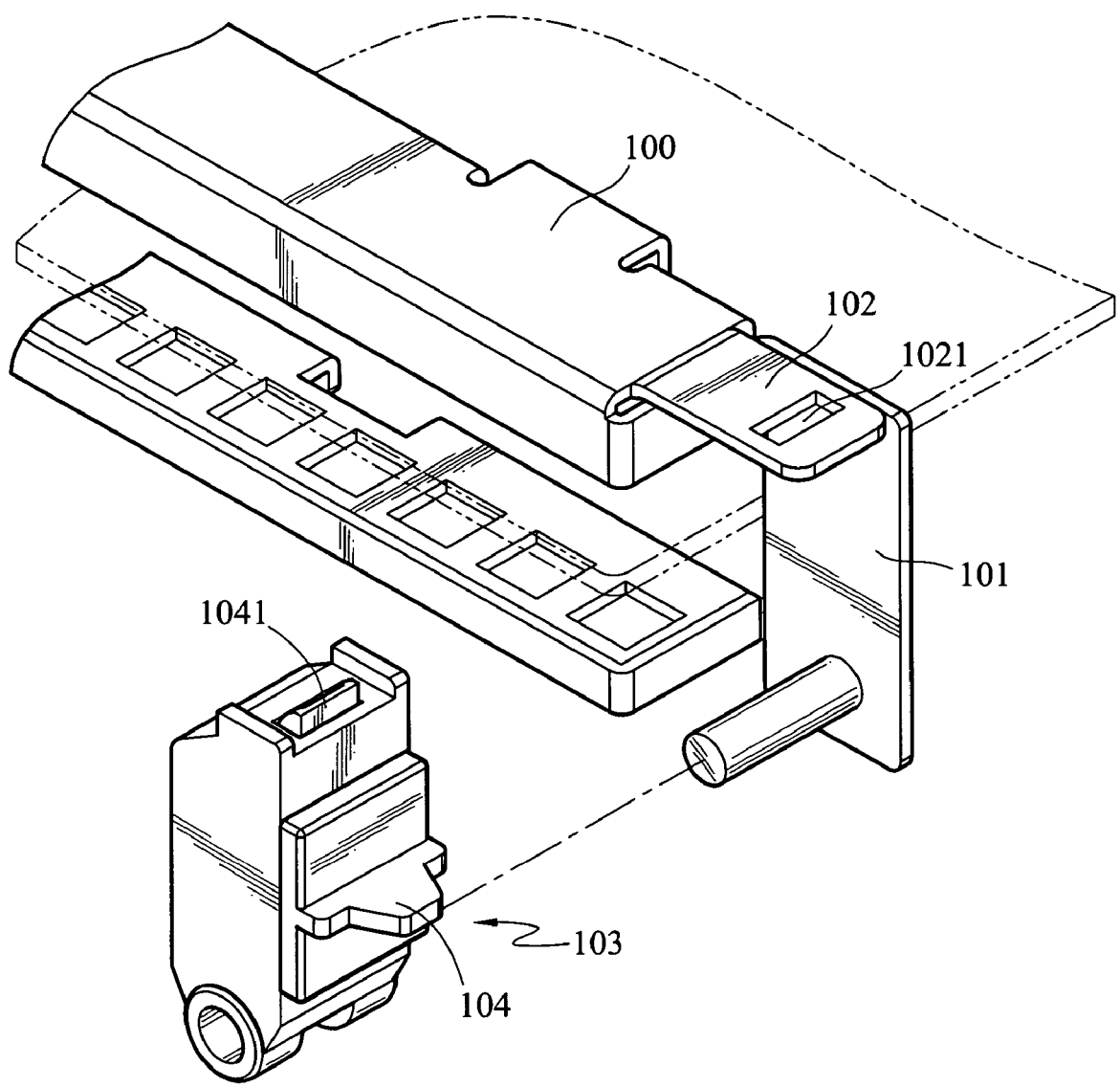
FIG. 1 is a schematic view of a conventional interface card coupling structure.
Figure 2:
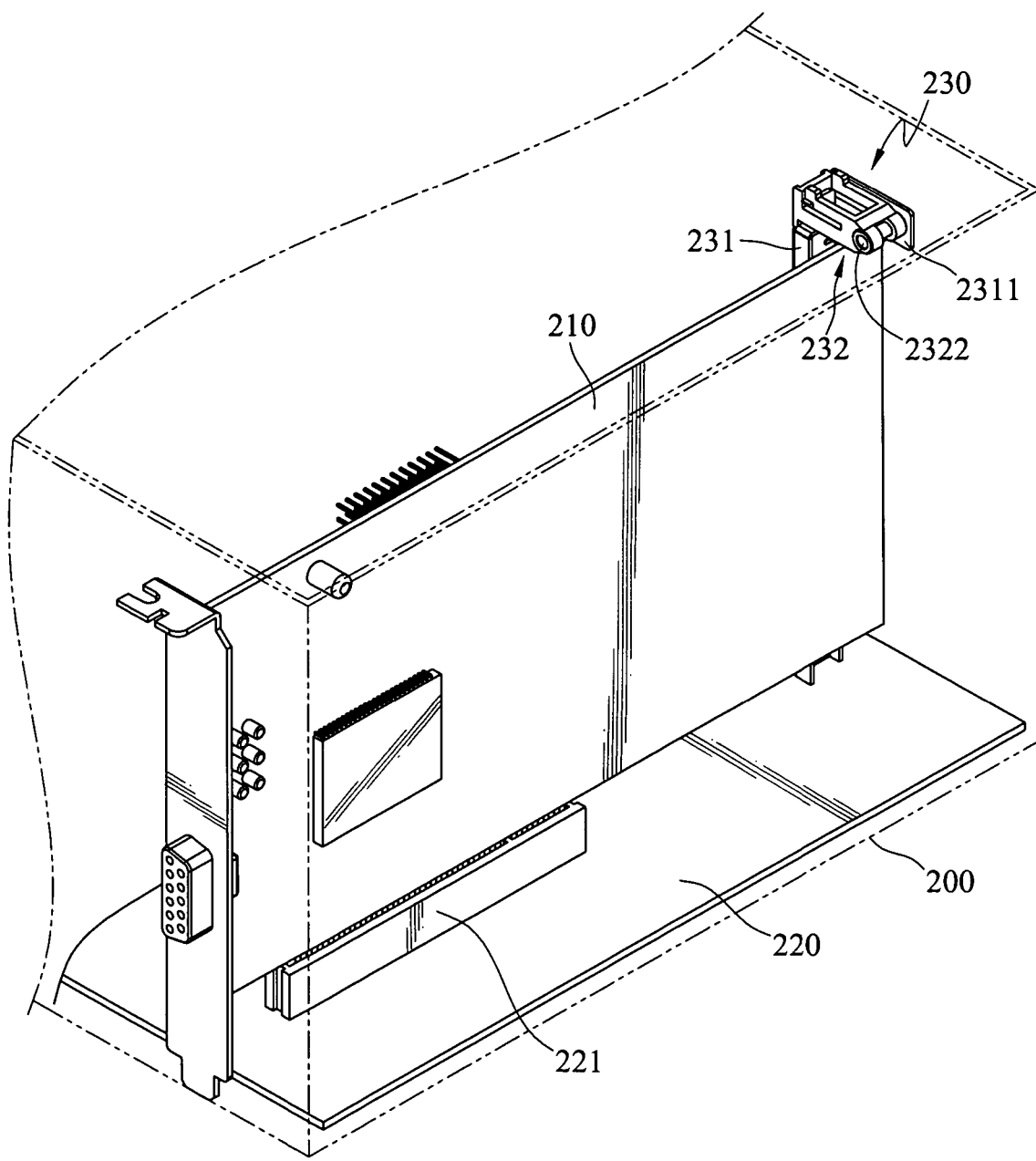
FIG. 2 is a schematic view of the invention.

Referring to FIG. 2, the interface coupling structure 230 according to the invention is fixedly mounted onto a case 200, which houses an interface card 210 and a mainboard 220. The interface coupling structure 230 aims to securely couple the interface card 210 on the mainboard 220. The interface coupling structure 230 includes a bracing member 231 and a coupling member 232. Details of their structure and coupling relationship are elaborated as follows.

Figure 3:
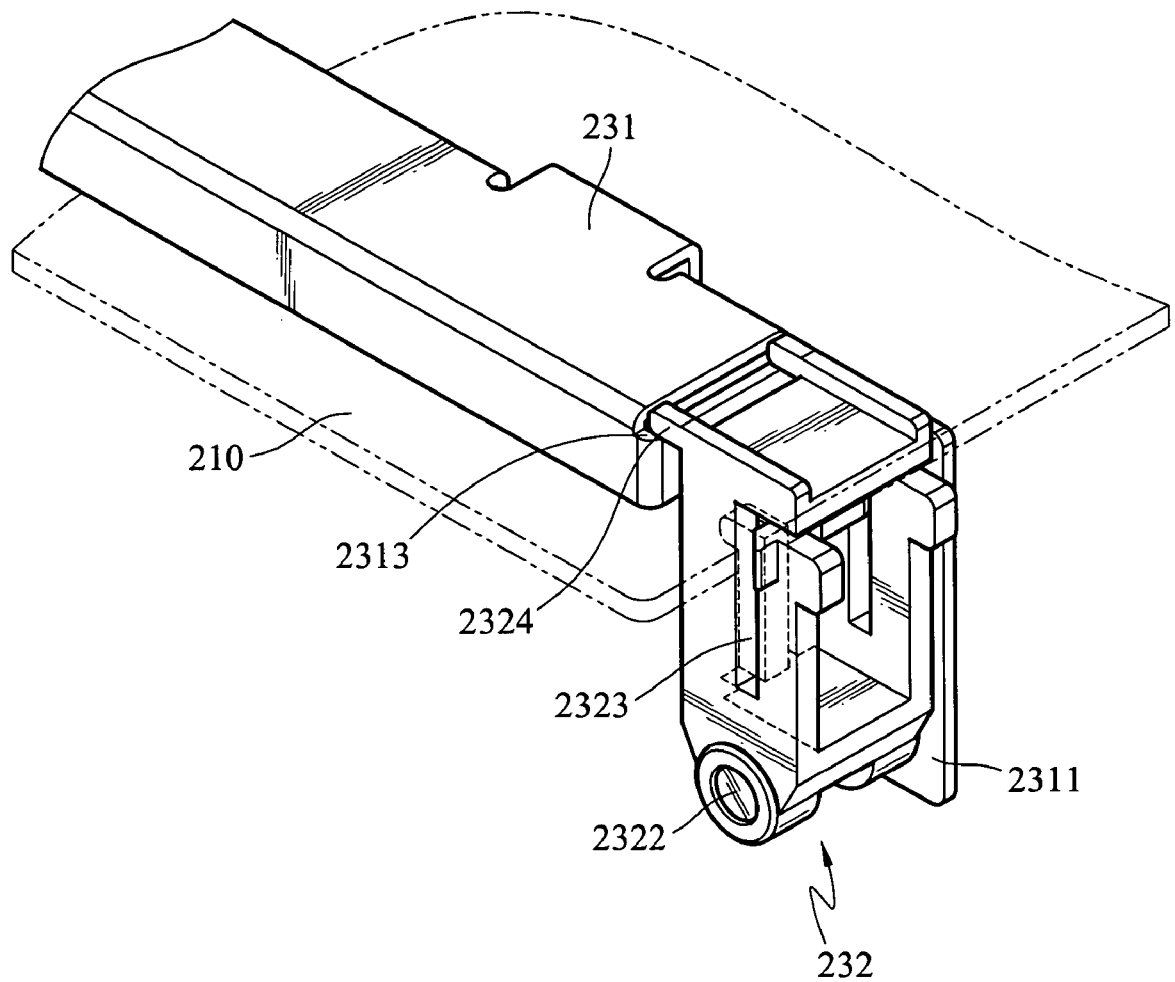
FIG. 3 is a fragmentary schematic view of the invention.
Figure 4:
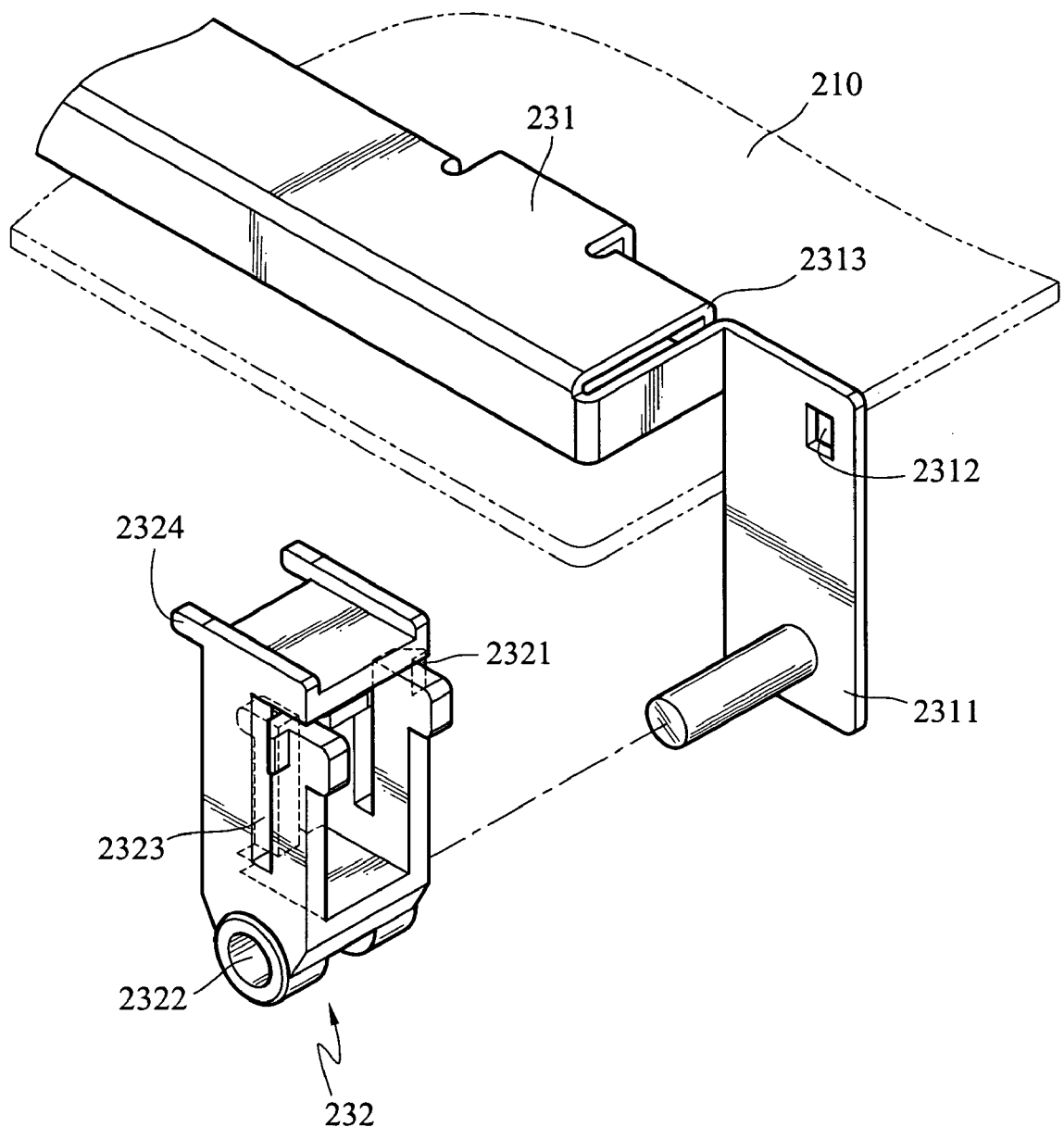
FIG. 4 is an exploded view of the invention.

Referring to FIGS. 3 and 4, the bracing member 231 is fixedly located on the case 200. It has a retaining plate 2311 extending from one end. The retaining member 2311 has a latch hole 2312. The bracing member 231 further has a notch 2313 on the end where the retaining plate 2311 is located. The notch 2313 is located on the edge of the bracing member 231 and is formed substantially in a step manner. The coupling member 232 aims to latch the interface card 210 to prevent the interface card 210 from breaking away from the mainboard 220 when subject to external vibration. The coupling member 232 is pivotally coupled on the retaining plate 2311, and has a latch pin 2321 on one end facing the retaining plate 2311 to mate with the latch hole 2312 of the retaining plate 2311. Hence the latch pin 2321 can be engaged with the latch hole 2312 to anchor the coupling member 232 on the retaining plate 2311. The coupling member 232 also has a clipping member 2323 on a pivotal coupling end 2322 to clip the interface card 210, which may have slight dimensional variations even with the same specifications. The clipping member 2323 has one end fastened to the pivotal coupling end 2322 of the coupling member 232 and another free end that is elastic. Hence when the coupling member 232 is coupled on the retaining plate 2311, the clipping member 2323 can clip the interface card 210 securely with elastic force to withstand vibration occurring to the interface card coupling structure 230. In addition, the coupling member 232 has a stopping member 2324 mating with and resting on the notch 2313 when the coupling member 232 is coupled on the retaining plate 2311.

The coupling member 232 may be made from polymers such as ABS resin, PC, PS, and the like by injection processing so that it can be produced in large quantity at a lower cost and shorter assembly time.

Figure 5:
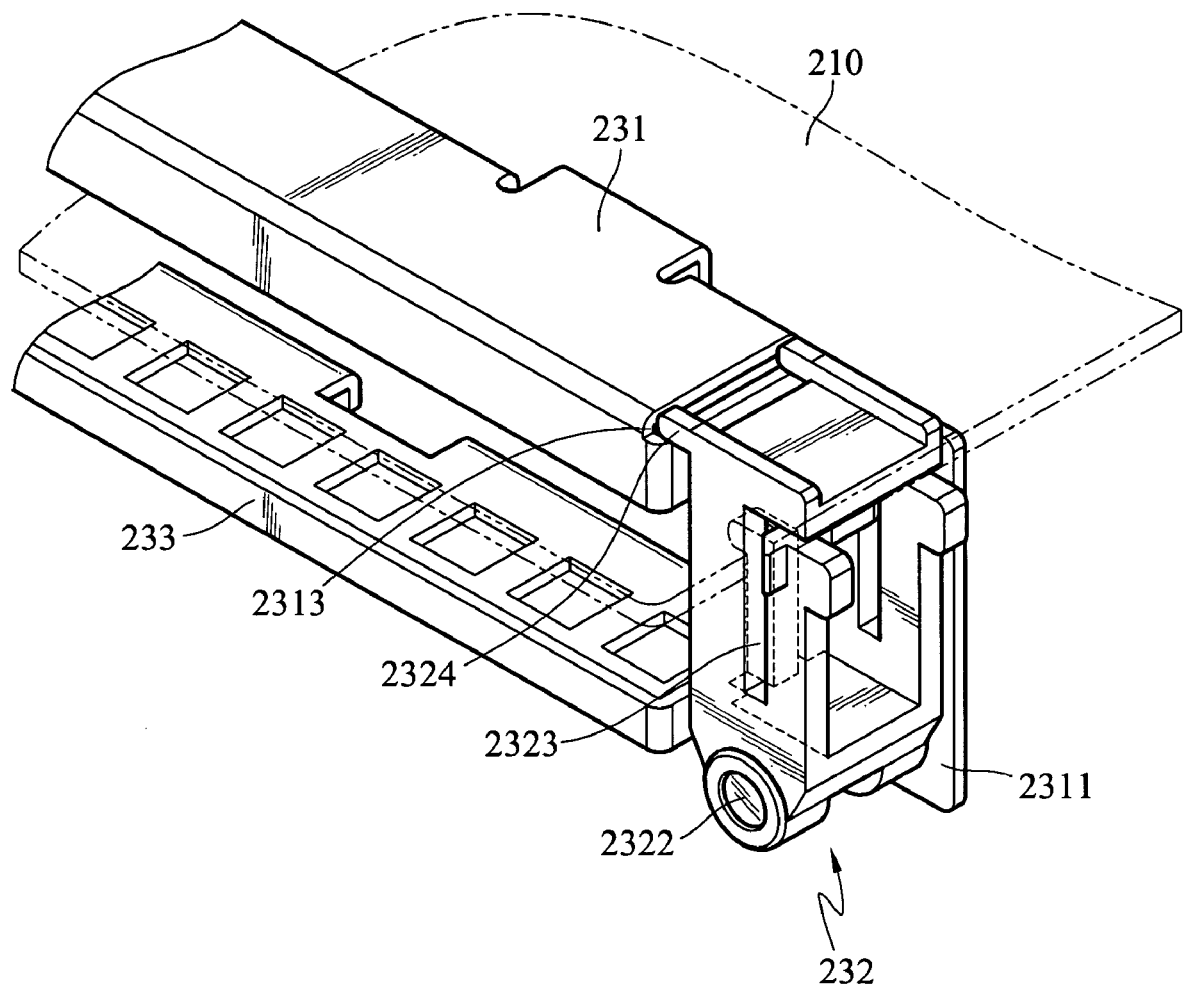
FIG. 5 is a perspective view of another embodiment of the invention.
Figure 6:
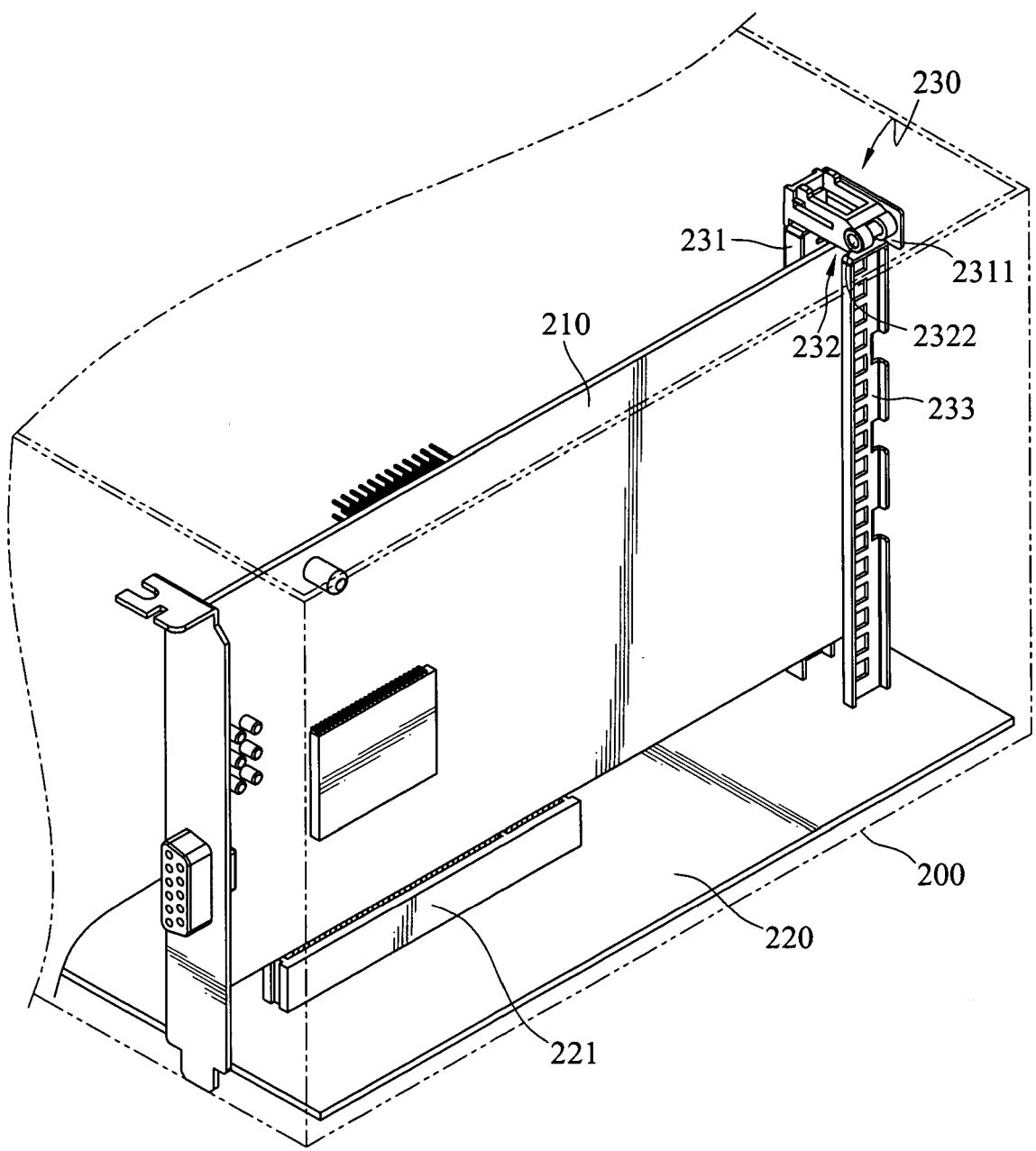
FIG. 6 is a schematic view of another embodiment of the invention.

Referring to FIGS. 5 and 6, to further enhance the coupling effect, a second bracing member 233 may be provided and mounted onto the case 200. The second bracing member 233 is parallel with the bracing member 231, and has one end corresponding to the pivotal coupling end 2322 of the coupling member 232 so that all the edges of the interface card 210 are braced to enhance the coupling and bracing effect.

Referring to FIG. 3, the bracing member 231 is anchored on the case 200. The retaining plate 2311 is extended from the edge of the bracing member 231. The coupling member 232 is pivotally coupled on the retaining plate 2311, and the stopping member 2324 of the coupling member 232 is resting on the notch 2313 of the retaining plate 2311. The coupling member 232 is pivotally coupled on the retaining member 2311, which is extended from the bracing member 231. Hence the bracing structure of the coupling member 232 tends to sway. With the stopping member 2324 on another end of the coupling member 232 resting on the notch 2313, the rigidity of the retaining plate 2311 is improved.

Referring to FIG. 2, when the interface card 210 is inserted in the mainboard 220, the main bracing structure of the interface card 210 is an insertion slot 221 on the mainboard 220. The interfaces compatible to the general insertion slot 221 are the PCI interface, AGP interface, ISA interface, and the like. The insertion slot 221 has a length of about 12 centimeters. If the interface card 210 has a total length of 20 centimeters or more, the insertion slot 221 alone cannot firmly anchor the interface card 210 on the mainboard 220, and vibration could cause the interface card 210 to break away from the insertion slot 221. With the interface coupling structure 230 of the invention mounted onto the case 200 as previously discussed, the coupling member 232 presses the interface card 210 on one end remote from the insertion slot 221 towards the insertion slot 221, so the interface card 210 can be anchored securely on the mainboard 220.

In short, the various embodiments of the invention set forth above provide many benefits.

The structure of the coupling member is simple and can be made by injection forming. Hence many separate elements of the conventional coupling member are integrated to become one element with the same coupling result. Assembly time is reduced, fabrication cost is lowered, and production is faster.

The elements of the bracing member are fewer. The coupling method of the invention does not require an additional element to provide the latch hole. The retaining plate pivotally coupled with the coupling member has a latch hole to engage with the latch pin to anchor the coupling member on the retaining plate. Thus the elements of the bracing member are reduced, and the structure is simplified. This can also reduce assembly time, lower the fabrication cost, and increase the production speed.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An interface card coupling structure for coupling at least one interface card on a case, comprising:
   a bracing member fixedly mounted onto the case including a retaining plate which has a latch hole; and
   a coupling member which is pivotally coupled on the retaining plate and has a latch pin on one end facing the retaining plate to engage with the latch hole to anchor the coupling member on the retaining plate, the coupling member has a pivotal coupling end which has a clipping member to clip the interface card;
   wherein the coupling member has a stopping member on one end, the bracing member having a notch been formed substantially in a step manner on one end, the coupling member being latched on the retaining plate with the stopping member resting on the notch.

2. The interface card coupling structure of claim 1, wherein the retaining plate is extended from an edge of the bracing member.

3. The interface card coupling structure of claim 1, wherein the clipping member has one end fastened to the pivotal coupling end and another end being a free end.

4. The interface card coupling structure of claim 1, wherein the clipping member is elastic.

5. The interface card coupling structure of claim 1, wherein the coupling member has a stopping member on one end, the bracing member having a notch on one end, the coupling member being latched on the retaining plate with the stopping member resting on the notch.

6. The interface card coupling structure of claim 1, wherein the coupling member is formed by an injection process.

7. The interface card coupling structure of claim 1, wherein the coupling member is made from polymers.

8. The interface card coupling structure of claim 1 further including a second bracing member which is fixedly mounted onto the case and parallel with the bracing member.

9. The interface card coupling structure of claim 8, wherein the second bracing member has one end corresponding to the pivotal coupling end of the coupling member.

* * * * *